United States Patent
Bates et al.

(10) Patent No.: US 7,848,441 B2
(45) Date of Patent: Dec. 7, 2010

(54) APPARATUS AND METHOD TO GENERATE CONVOLUTION ENCODED DATA

(75) Inventors: Allen Keith Bates, Tucson, AZ (US); Nils Haustein, Soergenloch (DE); Craig Anthony Klein, Tucson, AZ (US); Daniel James Winarski, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 657 days.

(21) Appl. No.: 11/836,678

(22) Filed: Aug. 9, 2007

(65) Prior Publication Data

US 2009/0041164 A1 Feb. 12, 2009

(51) Int. Cl.
*H04L 5/12* (2006.01)
*H04L 23/02* (2006.01)

(52) U.S. Cl. .................. 375/265; 714/786
(58) Field of Classification Search .......... 375/265; 714/786

See application file for complete search history.

(56) References Cited

U.S. PATENT DOCUMENTS 6,601,216 B1 7/2003 Obata

2005/0066251 A1 3/2005 Srivastava
2005/0278605 A1* 12/2005 Xu et al. ............... 714/758
2008/0008272 A1* 1/2008 Yang et al. ............ 375/341

OTHER PUBLICATIONS

Gutman, M., "A Method for Updating a Cyclic Redundancy Code," IEEE Service Center, Jun. 1, 1992, pp. 989-991, vol. 40, No. 6, Piscataway, NJ, US.

* cited by examiner

*Primary Examiner*—Curtis B Odom
(74) *Attorney, Agent, or Firm*—Dale F. Regelman; Quarles & Brady LLP

(57) ABSTRACT

An apparatus and method are disclosed to generate convolution encoded data. The method supplies a convolution encoder. The method receives original data and generates convolution encoded original data. The method receives revised data. The method generates an XOR data stream by Exclusive OR'ing the original data with the revised data, forms a convolution encoded XOR data stream using the convolution encoder, and Exclusive ORs the convolution encoded XOR data stream with the convolution encoded original data to generate convolution-encoded revised data.

22 Claims, 20 Drawing Sheets

| INITIAL STATE 310 | DESTINATION STATE 320 | ORIGINAL DATA 330 | ENCODED DATA 340 |
|---|---|---|---|
| $S_0$ | $S_0$ | 0 | 00 |
| $S_0$ | $S_1$ | 1 | 11 |
| $S_1$ | $S_2$ | 0 | 01 |
| $S_1$ | $S_3$ | 1 | 10 |
| $S_2$ | $S_4$ | 0 | 11 |
| $S_2$ | $S_5$ | 1 | 00 |
| $S_3$ | $S_6$ | 0 | 10 |
| $S_3$ | $S_7$ | 1 | 01 |
| $S_4$ | $S_0$ | 0 | 11 |
| $S_4$ | $S_1$ | 1 | 00 |
| $S_5$ | $S_2$ | 0 | 10 |
| $S_5$ | $S_3$ | 1 | 01 |
| $S_6$ | $S_4$ | 0 | 00 |
| $S_6$ | $S_5$ | 1 | 11 |
| $S_7$ | $S_6$ | 0 | 01 |
| $S_7$ | $S_7$ | 1 | 10 |

11111111111110000011111111111111111
         ⏟
      CHANGED
       BITS
        )
       615

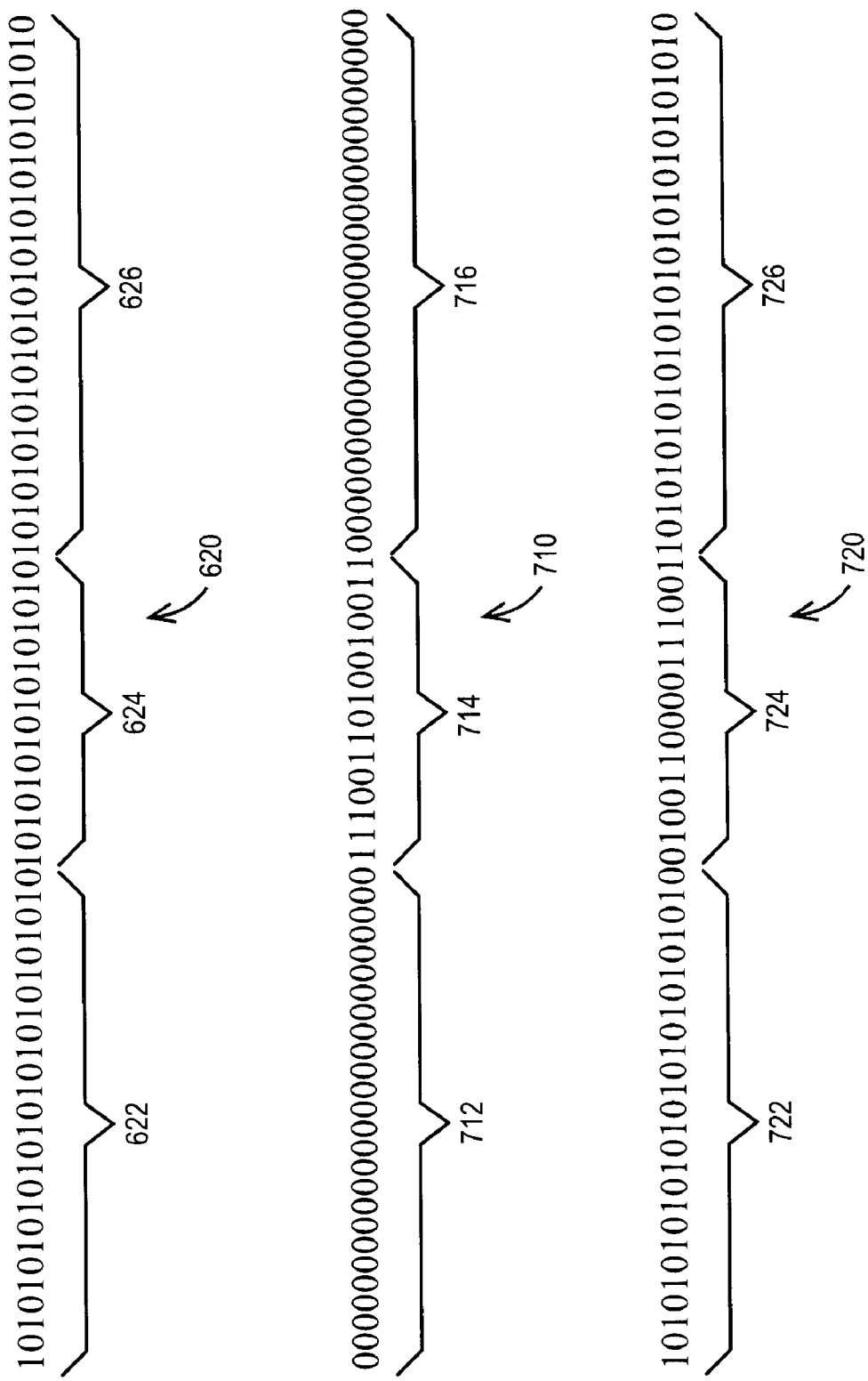

FIG. 8A $$\underbrace{1111}_{\substack{\text{CHANGED} \\ \big) \\ 804}}\underbrace{10000000000000000}_{\substack{\text{TRAILING ZEROS} \\ \big) \\ 806}}$$

FIG. 9A $$\underbrace{11111}_{\substack{\text{CHANGED} \\ 902}} \underbrace{000}_{\substack{m \text{ ZEROS} \\ 904}}$$

900

CHANGED +
(m) TRAILING ZEROS

APPARATUS AND METHOD TO GENERATE CONVOLUTION ENCODED DATA

FIELD OF THE INVENTION

This invention relates to apparatus and method to generate convolution encoded data.

BACKGROUND OF THE INVENTION

Data storage systems are used to store information provided by one or more host computer systems. Data storage systems sometimes save information provided by one or more host computer systems using one or more encoding protocols. In addition, data storage systems receive revised data from one or more host computer systems. Data storage systems sometimes save such revised information using one or more encoding protocols.

SUMMARY OF THE INVENTION

Applicants' invention comprises an apparatus and method to generate convolution encoded data. The method supplies a convolution encoder. The method further receives original data and generates convolution encoded original data. The method receives revised data. The method generates an XOR data stream by Exclusive OR'ing the original data with the revised data, forms a convolution encoded XOR data stream using the convolution encoder, and Exclusive ORs the convolution encoded XOR data stream with the convolution encoded original data to generate convolution-encoded revised data.

BRIEF DESCRIPTION OF THE DRAWINGS

The invention will be better understood from a reading of the following detailed description taken in conjunction with the drawings in which like reference designators are used to designate like elements, and in which:

FIG. 6A shows original data used to illustrate Applicants' method;

FIG. 6B shows revised data used to illustrate Applicants' method;

FIG. 6C shows the original data of FIG. 6A after that original data has been convolution encoded using the convolution encoder circuit of FIG. 2;

FIG. 7C shows the convolution encoded original data of FIG. 6C being Exclusive OR'd with the convolution encoded XOR data stream of FIG. 7B to generate convolution encoded revised data;

FIG. 8A shows a first truncated XOR data stream formed by deleting the leading zero portion from the XOR data stream of FIG. 7A;

FIG. 8C shows the convolution encoded first truncated XOR data stream of FIG. 8B indexed with the convolution encoded original data of FIG. 6C;

FIG. 9A shows a second truncated XOR data stream formed by deleting a portion of the trailing zero portion from the first truncated XOR data stream of FIG. 8A;

FIG. 9C shows the convolution encoded second truncated XOR data stream of FIG. 8B indexed with the convolution encoded original data of FIG. 6C;

DETAILED DESCRIPTION OF THE PREFERRED EMBODIMENTS

This invention is described in preferred embodiments in the following description with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of the invention may be combined in any suitable manner in one or more embodiments. In the following description, numerous specific details are recited to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
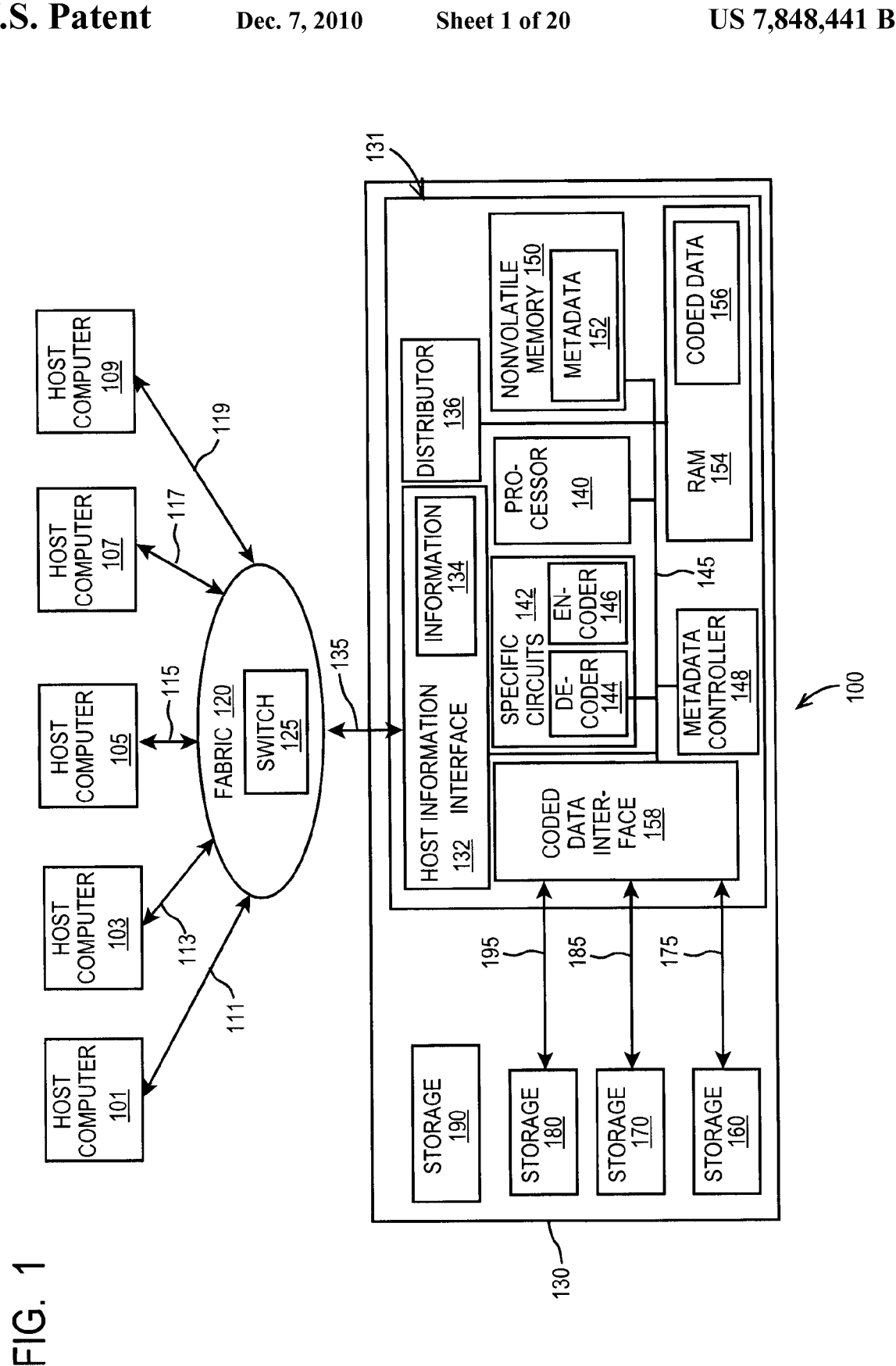
FIG. 1 is a block diagram illustrating one embodiment of Applicants' data storage system.

FIG. 1 illustrates Applicants' data storage system 100. In the illustrated embodiment of FIG. 1, system 100 comprises a switched-access-network, wherein one or more switches 125 are used to create a switching fabric 120. In certain embodiments data storage system 100 is implemented using the Small Computer Systems Interface (SCSI) protocol running over a Fibre Channel ("FC") physical layer. In other embodiments, data storage system 100 may be implemented utilizing other protocols, such as Infiniband, FICON (a specialized form of Fibre Channel CONnectivity), TCP/IP, Ethernet, Gigabit Ethernet, or iSCSI. The switches 125 have the addresses of both the hosts 101, 103, 105, 107, 109 and controller 131 so that any of hosts 101, 103, 105, 107, and/or 109, can be interchangeably connected to any controller 131.

Host computers 101, 103, 105, 107, and 109, each comprise a computing system, such as a mainframe, personal computer, workstation, and combinations thereof, including an operating system such as Windows, AIX, Unix, MVS, LINUX, etc. (Windows is a registered trademark of Microsoft Corporation; AIX is a registered trademark and MVS is a trademark of IBM Corporation; UNIX is a registered trademark in the United States and other countries licensed exclusively through The Open Group; and LINUX is a registered trademark of Linus Torvald). In certain embodiments, host computers 101, 103, 105, 107, and 109 further include a storage management program. The storage management program in the host computers 101, 103, 105, 107, and 109 may include the functionality of storage management type programs known in the art that manage the transfer of data to and from a data storage and retrieval system, such as the IBM DFSMS implemented in the IBM MVS operating system.

Host computers 101, 103, 105, 107, and 109, are coupled to fabric 120 utilizing I/O interfaces 111, 113, 115, 117, and 119, respectively. I/O interfaces 111, 113, 115, 117, and 119, may be any type of I/O interface; for example, a FC arbitrated loop, a point-to-point FC connection to fabric 120 or another form of one or more signal lines used by host computers 101, 103, 105, 107, and 109, to transfer information directly to and from fabric 120. Fabric 120 includes, for example, one or more FC switches 125 used to connect two or more computer networks. In certain embodiments, FC switch 125 is a conventional router switch. In an alternate embodiment, host computers 101, 103, 105, 107, and/or 109, are connected in a point-to-point configuration to storage controller 131 without a switch.

Switch 125 interconnects host computers 101, 103, 105, 107, and 109, to controller 131 across I/O interface 135. I/O interface 135 may be any type of I/O interface, for example, a Fibre Channel, Infiniband, Gigabit Ethernet, Ethernet, TCP/IP, iSCSI, SCSI I/O interface or one or more signal lines used by FC switch 125 to transfer information respectively to and from controller 131 and subsequently to a plurality of data storage media 160, 170, 180, and 190. Alternately, data storage media 160, 170, 180, and 190, could be physically remote from each other as well as controller 131, so that a single disaster could jeopardize only one of data storage media 160, 170, 180, and 190. By "data storage medium," Applicants' mean a data storage medium in combination with hardware, software, and/or firmware, required to read data from, and write data to, that data storage medium.

In certain embodiments, one or more of data storage media 160, 170, 180, and/or 190, comprise a magnetic data storage medium, such as and without limitation a magnetic disk, magnetic tape, and the like. In certain embodiments, one or more of data storage media 160, 170, 180, and/or 190, comprise an optical storage medium, such as and without limitation a CD, DVD, HD-DVD, Blu-Ray, and the like. In certain embodiments, one or more of data storage media 160, 170, 180, and/or 190, comprise an electronic data storage media, such as and without limitation a PROM, EPROM, EEPROM, Flash PROM, compactflash, smartmedia, and the like. In certain embodiments, one or more of data storage media 160, 170, 180, and/or 190, comprise a holographic data storage medium.

Storage array 130 comprises controller 131 and storage media 160, 170, 180, and 190. Controller 131 and storage media 160, 170, 180, and 190 may be co-located in a common frame or box. Alternately, controller 131 and storage media 160, 170, 180, and 190 may be spread apart geographically, for disaster recovery reasons, in what is sometimes called a geoplex. Storage media 160, 170, 180, and/or 190 may also have separate and distinct controllers working in conjunction to provide access to said storage in the geoplex.

Controller 131 may take many different forms and may include an embedded system, a distributed control system, a personal computer, workstation, etc. In the illustrated embodiment of FIG. 1, storage controller 131 comprises processor 140, metadata controller 148, random access memory (RAM) 154, nonvolatile memory 150, specific circuits 142, coded data interface 158, and host information interface 132. Host information interface 132 holds information 134 which will either be encoded by encoder 146 during a write operation to storage media 160, 170, 180, 190; or has been read and decoded by decoder 144 during a read operation from storage media 160, 170, 180, 190. In certain embodiments, RAM 154 is used as a data cache. Processor 140, RAM 154, nonvolatile memory 150, specific circuits 142, metadata controller 148, coded data interface 158 and host information interface 132 communicate with each other across bus 145.

Alternatively, RAM 154 and/or nonvolatile memory 150 may reside in processor 140 along with specific circuits 142, coded data interface 158, metadata controller 148, and host information interface 132. Processor 140 may include an off-the-shelf microprocessor, custom processor, FPGA, ASIC, or other form of discrete logic. In certain embodiments, RAM 154 is used as a cache for data written by hosts 101, 103, 105, 107, and/or 109, or read for hosts 101, 103, 105, 107, and/or 109, to hold calculated data, stack data, executable instructions, etc. In certain embodiments, RAM 154 is used for the temporary storage of convolution-encoded data 156 received from encoder 146 before that convolution-encoded data is stored on data storage media 160, 170, 180, and 190.

Nonvolatile memory 150 may comprise any type of nonvolatile memory such as Electrically Erasable Programmable Read Only Memory (EEPROM), flash Programmable Read Only Memory (PROM), battery backup RAM, hard disk drive, or other similar device. Nonvolatile memory 150 is typically used to hold the executable firmware and any nonvolatile data, such as metadata 152.

In certain embodiments, coded data interface 158 comprises one or more communication interfaces that allow processor 140 to communicate with data storage media 160, 170, 180, and 190. Host information interface 132 allows processor 140 to communicate with fabric 120, switch 125 and hosts 101, 103, 105, 107, and/or 109. Examples of coded data interface 158 and host information interface 132 include serial interfaces such as RS-232, USB (Universal Serial Bus), SCSI (Small Computer Systems Interface), Fibre Channel, Gigabit Ethernet, etc. In addition, coded data interface 158 and/or host information interface 132 may comprise a wireless interface such as radio frequency, such as and without limitation, Bluetooth, or an optical communications device, such as and without limitation a device using Infrared frequencies.

In certain embodiments, metadata controller 148 is implemented in processor 140 by software, firmware, dedicated logic or combinations thereof. In addition, all or part of metadata controller 148 may reside outside controller 131, such as in a software implementation in one of hosts 101, 103, 105, 107, and/or 109. Metadata controller 148, manages metadata associated with information received for storage as convolution-encoded data on storage devices. In certain embodiments, metadata controller 148 is responsible for generating, changing, maintaining, storing, retrieving and processing metadata (i.e. metadata 152) associated with information received for storage as convolution-encoded data.

In certain embodiments, distributor 136 is implemented in processor 140 by software, firmware, dedicated logic or combinations thereof. In addition, all or part of distributor 136 may reside outside controller 131, such as in a software implementation in one of hosts 101, 103, 105, 107, and/or 109. Distributor 136 distributes convolution-encoded data to RAM, and/or directly to storage media 160, 170, 180, and/or 190. When distributor 136 distributes the convolution-encoded data to the plurality of data storage media, such as media 160, 170, 180, and 190, the distribution is done in accordance with metadata 152, so that the distributed convolution-encoded data can be later read from the storage devices and decoded into the original data or revised data.

Figure 2:
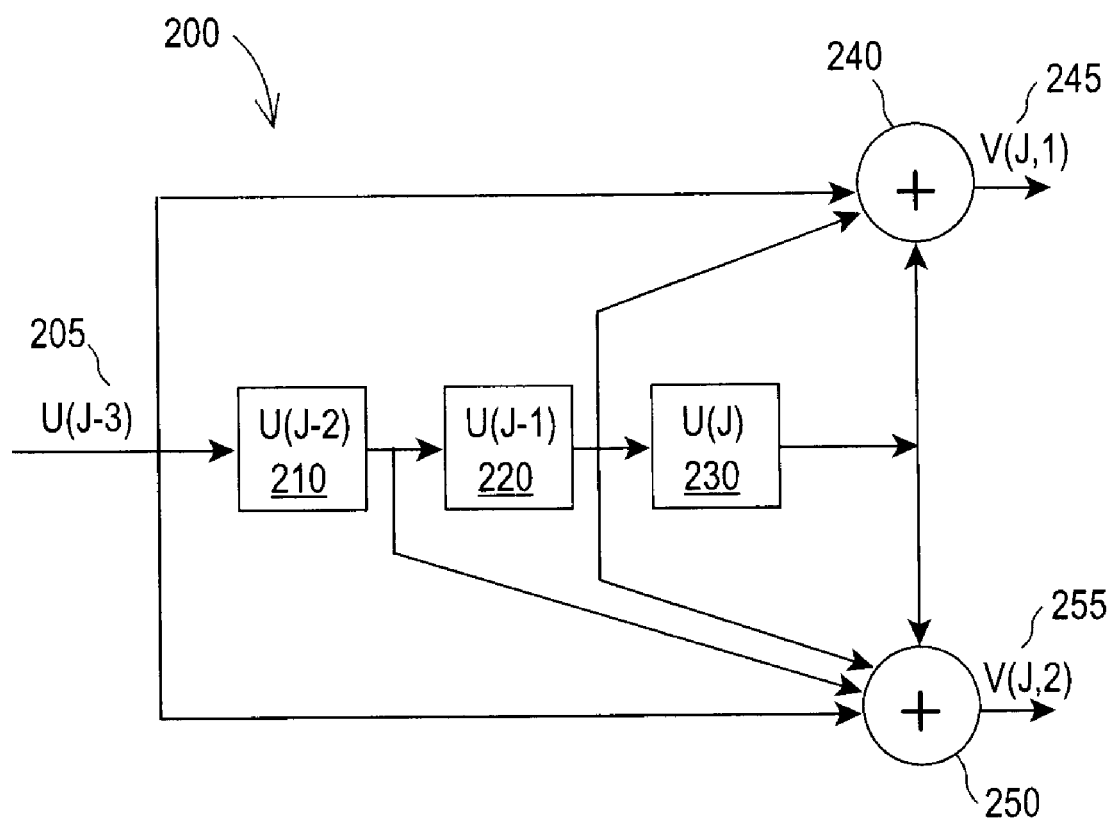
FIG. 2 shows one embodiment of Applicants' convolution encoder circuit.

Specific circuits 142 provide additional hardware to enable controller 131 to perform unique functions, such as fan control for the environmental cooling of data storage media 160, 170, 180, and 190, controller 131 and encoder 146. Encoder 146 may be implemented as a convolution encoder, such as and without limitation convolution encoder circuit 200 (FIG. 2). Specific circuits 142 may comprise electronics that provide Pulse Width Modulation (PWM) control, Analog to Digital Conversion (ADC), Digital to Analog Conversion (DAC), Exclusive OR ("XOR"), etc. In addition, all or part of specific circuits 142 may reside outside controller 131, such as in a software implementation in one of hosts 101, 103, 105, 107, and/or 109.

In certain embodiments, encoder 146 comprises a convolution encoder which encodes one data bit into a set of two data bits. In certain embodiments, encoder 146 comprises a convolution encoding algorithm embodied in Table 300 (FIG. 3) and state diagram 400 (FIG. 4). In certain embodiments, decoder 144 comprises PRML trellis 500 (FIG. 5). Decoder 144 could also comprise a stack diagram.

In certain embodiments, Applicants' invention implements a small write update, sometimes referred to as an "atomic" update, to an existing file. In certain embodiments, that existing file comprises previously convolution-encoded data. Applicants' method changes a relatively small portion of the previously convolution-encoded bits of data to other convolution-encoded bits of data within the already convolution-encoded data set, without having to re-convolution encode the entire data set. Nowhere does Applicants' method use row parity as used in RAIDs 3, 4, or 5. Nowhere does Applicants' method use diagonal parity as used in RAID-6.

Using Applicants' method, the incremental update comprises the Exclusive OR ("XOR") of the changed portion of the original data in combination with (m) trailing zeros, wherein (m) is the number of memory steps in the linear shift array of convolution-encoder circuit 200 (FIG. 2). Applicants' incremental update is convolution encoded, and then Exclusive OR'd with the original convolution-encoded data to complete the update.

Figure 10:
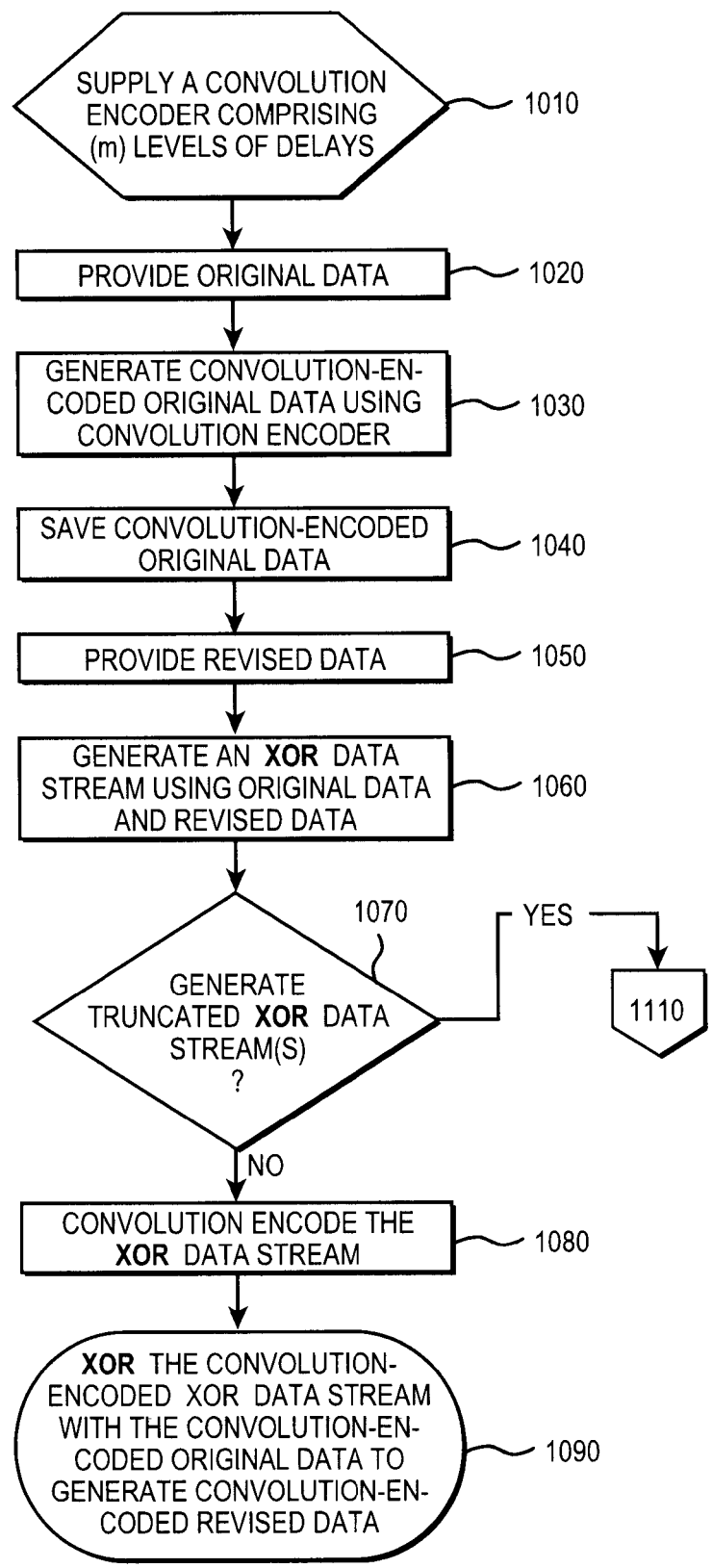
FIG. 10 is a flow chart summarizing the steps of a first embodiment of Applicants' method.

Referring now to FIG. 10, in step 1010 the method supplies a convolution encoder comprising (m) registers, i.e. (m) levels of delay. In certain embodiments, the convolution encoder of step 1010 is disposed in a data storage system, such as data storage system 100 (FIG. 1). In certain embodiments, the convolution encoder of step 1010 is disposed in a storage array, such as storage array 130 (FIG. 1). In certain embodiments, the convolution encoder of step 1010 is disposed in a storage controller, such as storage controller 131. In certain embodiments, the convolution encoder is disposed in an encoder, such as encoder 146 (FIG. 1), disposed in a storage controller, such as storage controller 131.

In certain embodiments, the convolution encoder of step 1010 comprises encoder circuit 200 (FIG. 2). In certain embodiments, the convolution encoder of step 1010 implements the encoding algorithm shown in Table 300 (FIG. 3) and state diagram 400 (FIG. 4).

Referring now to FIG. 2, convolution encoder circuit 200 receives input information stream U(J-3) 205 one bit at a time, for encoding. Encoder circuit 200 comprises a 3-stage shift register, comprising registers 210, 220, and 230. The initial contents of registers 210, 220, and 230, are preferably zero for the encoding process. The input information stream U(J-3) 205 and the outputs of registers 210, 220, and 230 are selectively added by adder 240 to produce output V(J,1) 245, and adder 250 to produce output V(J,2) 255. In certain embodiments, the modulo-2 adders 240 and 250 are implemented as XOR (Exclusive OR) gates in specific circuits 142. In other embodiments, adders 240 and 250 are implemented by use of software, firmware, dedicated logic, etc.

Figure 3:
FIG. 3 is a table which embodies Applicants' convolution encoding algorithm which is capable of encoding 1 bit of binary data into 2 bits of encoded data.
Figure 4:
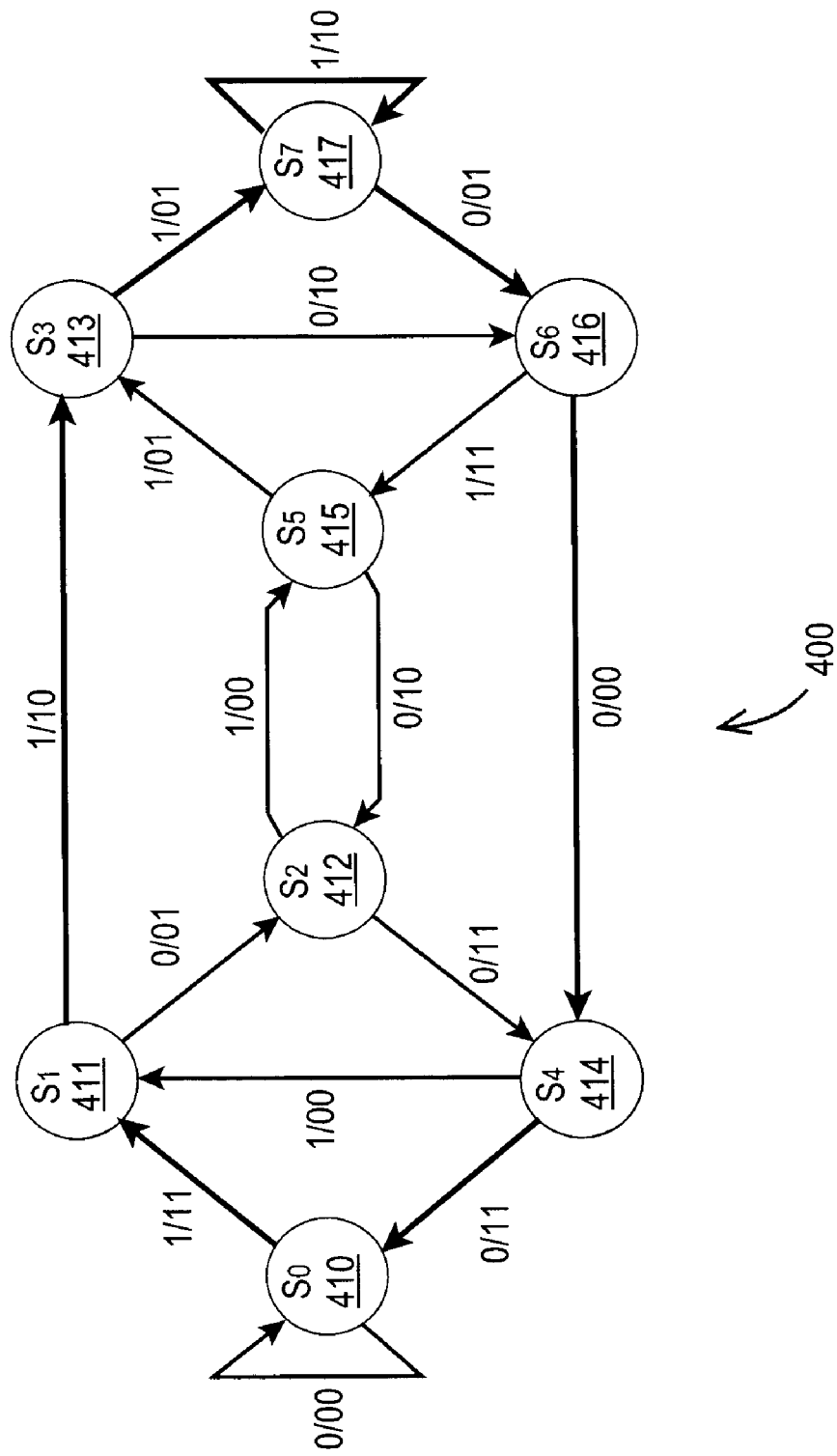
FIG. 4 comprises a state diagram which embodies Applicants' convolution encoding algorithm which is capable of encoding 1 bit of binary data into 2 bits of encoded data.
Figure 5:
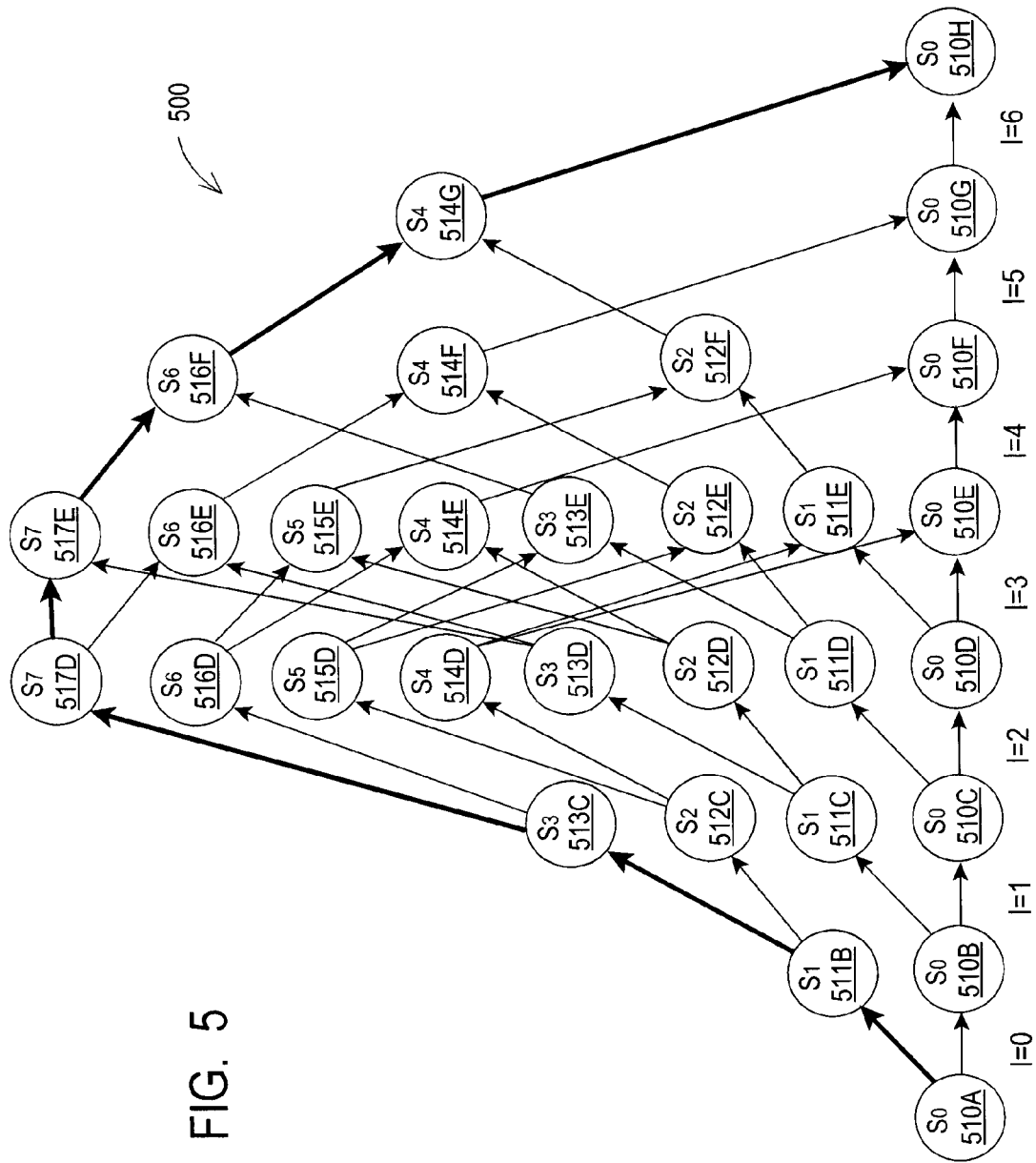
FIG. 5 illustrates a PRML trellis used to decode 2 bits of encoded data into 1 bit of binary data.

Referring now to FIGS. 3 and 4, in certain embodiments the convolution encoder of step 1010 utilizes the convolution encoding algorithm embodied in Table 300 and state diagram 400. This description of Applicants' apparatus and method should not be taken as limiting Applicants' apparatus and method to use of only the convolution encoder circuit 200, convolution encoding algorithm embodied in Table 300, and state diagram 400. Rather, in other embodiments Applicants' method utilizes differing convolution encoding algorithms.

The encoding algorithm of FIGS. 3 and 4 comprises eight states: $S_0$ 410, $S_1$ 411, $S_2$ 412, $S_3$ 413, $S_4$ 414, $S_5$ 415, $S_6$ 416, and $S_7$ 417. Each transition between states results in the encoding of one bit of original data as received from hosts 101, 103, 105, 107, and/or 109 into two bits of encoded data as shown in FIGS. 2, 3, and 4, which, in certain embodiments, are then stored in storage media 160, 170, 180, and 190.

Table 300 (FIG. 3) comprises four columns: initial state 310, destination state 320, original data 330, and convolution-encoded data 340. There are a total of sixteen rows in table 300, based on a total of eight states $S_0$, $S_1$, $S_2$, $S_3$, $S_4$, $S_5$, $S_6$, and $S_7$ and two possible transitions from each initial state. Table 300 was generated via state diagram 400 and is used herein to illustrate the encoding of original data to produce encoded data. Referring once again to FIG. 10, in step 1020 the method provides original data, such as original data 600 (FIG. 6A). In certain embodiments, the original data of step 1020 is provided by one or more host computers, such as and without limitation host computers 101 (FIG. 1), 103 (FIG. 1), 105 (FIG. 1), 107 (FIG. 1), and/or 109(FIG. 1). Step 1020 further comprises receiving the original data. In certain embodiments, the original data of step 1020 is received by a storage array, such as storage array 130 (FIG. 1). In certain embodiments, the original data of step 1020 is received by a storage controller, such as storage controller 131 (FIG. 1).

In step 1030, the method generates convolution-encoded original data using the convolution encoder of step 1010. As an example and referring now to FIGS. 2, 6A, and 6C, in step 1030 Applicants' method uses convolution encoder circuit 200 and original data 600 to generate convolution-encoded original data 620. In certain embodiments, step 1030 is performed by the host computer that provides the original data of step 1020. In certain embodiments, step 1030 is performed by a storage controller, such as storage controller 131 (FIG. 1). In certain embodiments, step 1030 is performed by a processor, such as processor 140 (FIG. 1), disposed in a storage controller. In certain embodiments, step 1030 is performed by encoder 146 (FIG. 1).

Referring once again to FIG. 10, in step 1040 the method saves the convolution-encoded original data of step 1030. In certain embodiments, the convolution-encoded original data of step 1030 is saved in one or more of data storage media 160 (FIG. 1), 170 (FIG. 1), 180 (FIG. 1), and/or 190 (FIG. 1). In certain embodiments, step 1040 is performed by the host computer that provides the original data of step 1020. In certain embodiments, step 1040 is performed by a storage controller, such as storage controller 131 (FIG. 1). In certain embodiments, step 1040 is performed by a processor, such as processor 140 (FIG. 1), disposed in a storage controller.

In step 1050, the method provides revised data, such as revised data 610 (FIG. 6B). Revised data 610 has changed bits 615 which are different from the respective bits in original data 600 (FIG. 6A). In certain embodiments, the revised data of step 1050 is provided by one or more host computers, such as and without limitation host computers 101 (FIG. 1), 103 (FIG. 1), 105 (FIG. 1), 107 (FIG. 1), and/or 109 (FIG. 1). Step 1050 further comprises receiving the revised data. In certain embodiments, the revised data of step 1050 is received by a storage array, such as storage array 130 (FIG. 1). In certain embodiments, the revised data of step 1050 is received by a storage controller, such as storage controller 131 (FIG. 1).

In step 1060, the method generates an XOR data stream by Exclusive OR'ing the original data of step 1020 with the revised data of step 1050.

As those skilled in the art will appreciate, by "Exclusive OR'ing" the original data is Exclusive-OR'd, bit by bit, with the revised data. Exclusive-OR'ing occurs only between corresponding bit positions in the original data and the revised data: bit 0 is exclusive-OR'd only with bit 0, bit 1 only with bit 1, and so on. Table 1 recites the four possible Exclusive-OR'ing results.

TABLE 1

| BIT VALUES | | |
| --- | --- | --- |
| Original Data | Revised Data | XOR Data Stream |
| 0 | 0 | 0 |
| 0 | 1 | 1 |
| 1 | 0 | 1 |
| 1 | 1 | 0 |

Figure 7A:
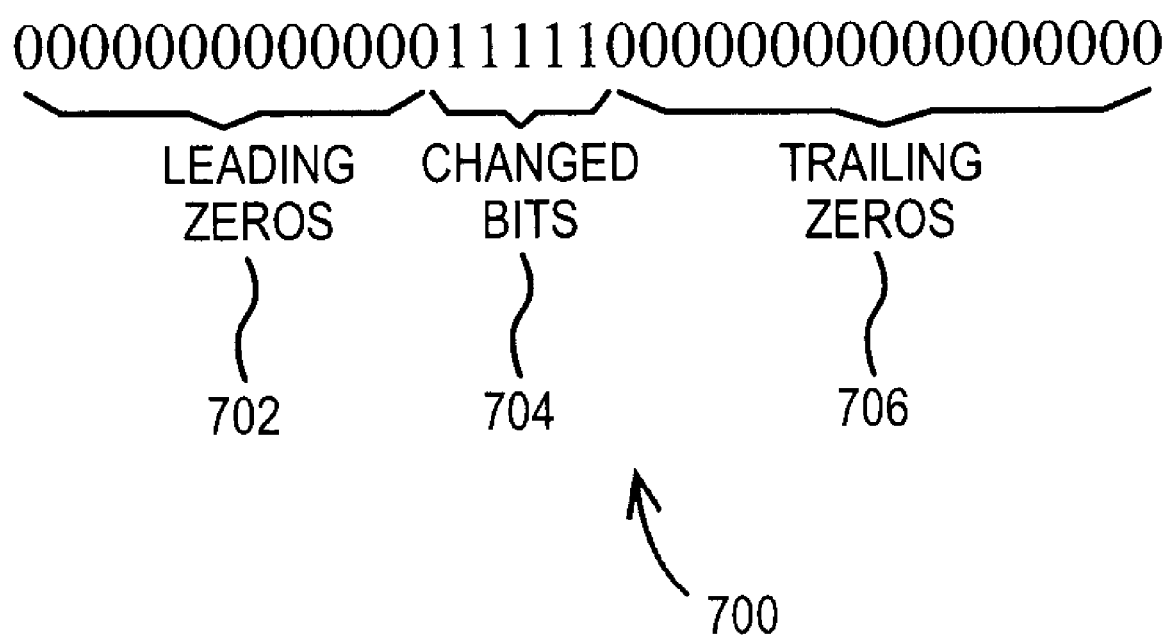
FIG. 7A shows an XOR data stream formed by Exclusive ORing the original data of FIG. 6A with the revised data of FIG. 6B.

Referring now to FIGS. 6A, 6B, and 7A, XOR data stream 700 is generated in step 1060 by Exclusive OR'ing original data 600 with revised data 610. XOR data stream 700 comprises portion 702 comprising a plurality of leading "0"s generated by Exclusive OR'ing corresponding and identical bits in original data 600 and in revised data 610. XOR data stream 700 further comprises portion 704 comprising a plurality of "1"s generated by Exclusive OR'ing corresponding bits in the original data 600 and the changed bits 615 in revised data 610. XOR data stream 700 further comprises portion 730 comprising a plurality of trailing "0"s generated by Exclusive OR'ing corresponding and identical bits in original data 600 and in revised data 610.

Referring once again to FIG. 10, in step 1070, the method determines whether to generate and use one or more truncated XOR data streams. In certain embodiments, step 1070 is performed by the host computer that provides the original data of step 1020. In certain embodiments, step 1070 is performed by a storage controller, such as storage controller 131 (FIG. 1). In certain embodiments, step 1070 is performed by a processor, such as processor 140 (FIG. 1), disposed in a storage controller.

If the method elects to not generate and use one or more truncated XOR data streams, then the method transitions from step 1070 to step 1080 wherein the method convolution encodes the XOR data stream of step 1060, such as XOR data stream 700. In certain embodiments, step 1080 is performed by the host computer that provides the original data of step 1020. In certain embodiments, step 1080 is performed by a storage controller, such as storage controller 131 (FIG. 1). In certain embodiments, step 1080 is performed by a processor, such as processor 140 (FIG. 1), disposed in a storage controller.

Figure 7B:
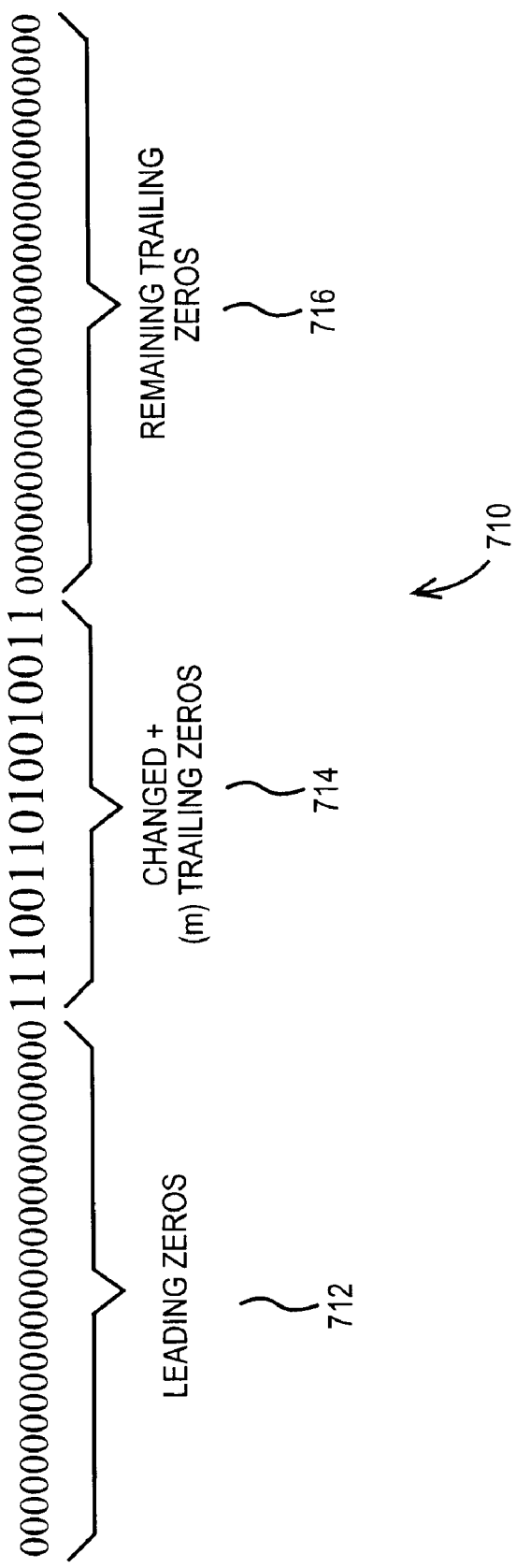
FIG. 7B shows a convolution encoded XOR data stream formed by convolution encoding the XOR data stream of FIG. 7A using the convolution encoder circuit of FIG. 2.

As an example and referring now to FIGS. 2, 7A, and 7B, convolution-encoded XOR data stream 710 is generated using XOR data stream 700 and convolution encoder circuit 200. Convolution-encoded XOR data stream 710 comprises portion 712 generated by convolution encoding portion 702 using encoder circuit 200. When convolution encoding the plurality of leading "0"s, encoder circuit 200 encodes each "0" into "00" representing recurring $S_0$ to $S_0$ transitions.

Convolution-encoded XOR data stream 710 further comprises portion 714 generated by convolution encoding portion 704 in combination with (m) trailing zeros, wherein for convolution encoder circuit 200, (m) has a value of 3. Encoder circuit 200 comprises three registers, namely registers 210, 220, and 230. As a result, convolution encoder circuit 200 encodes the first three trailing zeros before the encoder returns to state $S_0$. Thereafter, each trailing "0" is encoded into "00"s representing a recurring $S_0$ to $S_0$ transition. Convolution-encoded XOR data stream 710 further comprises portion 716 generated by convolution encoding the remaining trailing zeros of portion 706 using convolution encoder circuit 200.

Referring once again to FIG. 10, in step 1090 the method Exclusive ORs the convolution-encoded XOR data stream of step 1080 with the convolution-encoded original data of step 1030. In certain embodiments, step 1090 is performed by the host computer that provides the original data of step 1020. In certain embodiments, step 1090 is performed by a storage controller, such as storage controller 131 (FIG. 1). In certain embodiments, step 1090 is performed by a processor, such as processor 140 (FIG. 1), disposed in a storage controller.

As an example and referring now to FIG. 7C, in step 1090 the method Exclusive ORs convolution-encoded original data 620 with convolution-encoded XOR data stream 710 to generate convolution-encoded revised data 720. In this embodiment, the method in step 1090 Exclusive ORs portion 622 of convolution-encoded original data 620 with leading zero portion 712 of the convolution-encoded XOR data stream 710 to form convolution-encoded portion 722 of the revised data 720. In this embodiment, the method further Exclusive ORs portion 624 of convolution-encoded original data 620 with the changed bit/(m) trailing zero portion 714 of convolution-encoded XOR data stream 710 to form updated portion 724 of the revised data 720. In this embodiment, the method further Exclusive ORs portion 626 of convolution-encoded original data 620 with the remaining trailing zero portion 716 of convolution-encoded XOR data stream 710 to form convolution-encoded portion 726 of the revised data 720.

In other embodiments, Applicants' method utilizes a first truncated XOR data stream wherein the method deletes the leading zeros from XOR data stream 710, and then convolution encodes that first truncated XOR data stream, and then Exclusive ORs the convolution-encoded first truncated XOR data stream with the original data to generate the revised data.

In still other embodiments, Applicants' method utilizes a second truncated XOR data stream wherein the method further deletes from the first truncated XOR data stream all but (m) trailing zeros to form a second truncated XOR data stream, and then convolution encodes that second truncated XOR data stream, and then Exclusive ORs the convolution-encoded second truncated XOR data stream with the original data to generate the revised data.

Figure 11:
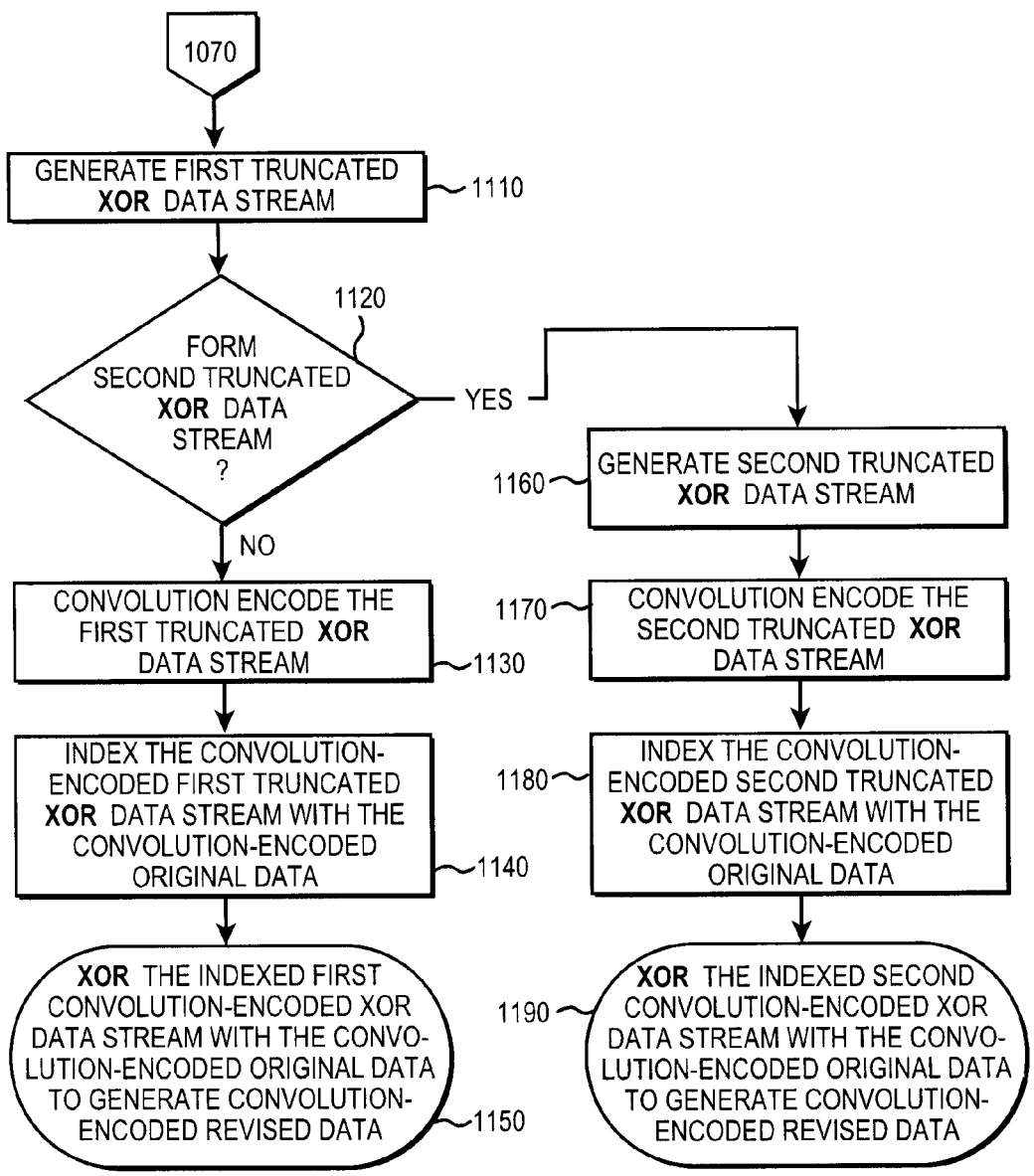
FIG. 11 is a flow chart summarizing additional steps comprising a second embodiment and a third embodiment of Applicants' method.

Referring again to FIG. 10, if the method elects in step 1070 to generate and use one or more truncated XOR data streams, then the method transitions from step 1070 to step 1110 (FIG. 11). In step 1110, the method generates a first truncated XOR data stream. In certain embodiments, step 1110 is performed by the host computer that provides the original data of step 1020 (FIG. 10). In certain embodiments, step 1110 is performed by a storage controller, such as storage controller 131 (FIG. 1). In certain embodiments, step 1110 is performed by a processor, such as processor 140 (FIG. 1), disposed in a storage controller.

As an example and referring now to FIGS. 7A and 8A, portion 702 of XOR data stream 700 comprises (N) leading zeros. In step 1110 the method generates a first truncated XOR data stream 800 by deleting the (N) leading zeros comprising portion 702 from XOR data stream 700. First truncated XOR data stream 800 comprises changed bit portion 804 in combination with a trailing zero portion 806.

Referring once again to FIG. 11, in step 1120 the method determines whether to generate and use a second truncated XOR data stream. In certain embodiments, step 1120 is performed by the host computer that provides the original data of step 1020 (FIG. 10). In certain embodiments, step 1120 is performed by a storage controller, such as storage controller 131 (FIG. 1). In certain embodiments, step 1120 is performed by a processor, such as processor 140 (FIG. 1), disposed in a storage controller.

If the method elects in step 1120 not to generate and use a second truncated XOR data stream, then the method transitions from step 1120 to step 1130 wherein the method convolution encodes the first truncated XOR data stream of step 1110, such as first truncated XOR data stream 810 (FIG. 8A). In certain embodiments, step 1130 is performed by the host computer that provides the original data of step 1020 (FIG. 10). In certain embodiments, step 1130 is performed by a storage controller, such as storage controller 131 (FIG. 1). In certain embodiments, step 1130 is performed by a processor, such as processor 140 (FIG. 1), disposed in a storage controller.

Figure 8B:
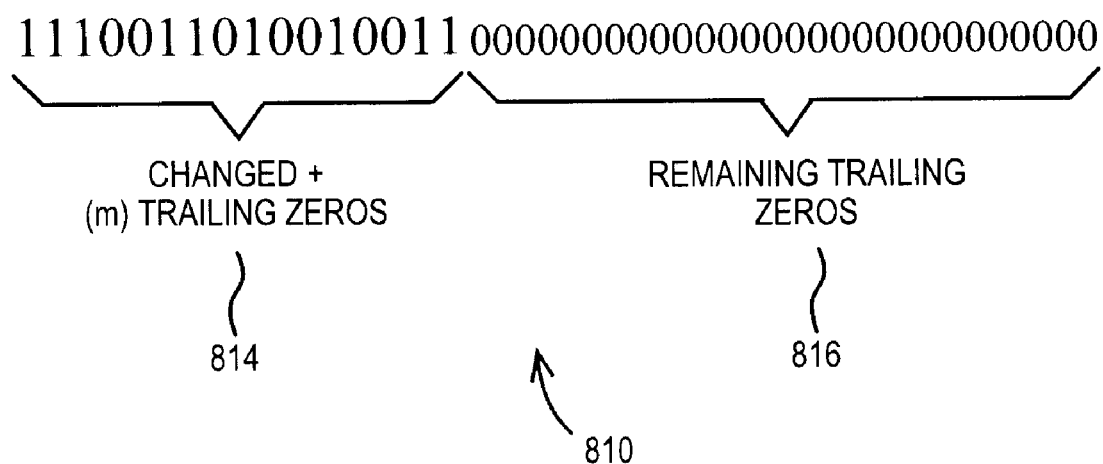
FIG. 8B shows a convolution encoded first truncated XOR data stream formed by convolution encoding the first truncated XOR data stream of FIG. 8A using the convolution encoder circuit of FIG. 2.

As an example and referring now to FIGS. 2, 8A, and 8B, convolution-encoded first truncated XOR data stream 810 is formed using first truncated XOR data stream 800 and convolution encoder circuit 200. Convolution-encoded first truncated XOR data stream 810 comprises portion 814 generated by convolution encoding portion 804 in combination with (m) trailing zeros, wherein for convolution encoder circuit 200, (m) has a value of 3. Encoder circuit 200 comprises three registers, namely registers 210, 220, and 230. As a result, convolution encoder circuit 200 encodes the first three trailing zeros before the encoder returns to state $S_0$. Thereafter, each trailing "0" is encoded into "00"s representing a recurring $S_0$ to $S_0$ transition. Convolution-encoded first truncated XOR data stream 810 further comprises portion 816 generated by convolution encoding the remaining trailing zeros of portion 806 using convolution encoder circuit 200.

Referring once again to FIG. 11, in step 1140 the method indexes the convolution-encoded first truncated XOR data stream of step 1130 to the convolution-encoded original data of step 1030 (FIG. 10). In step 1110, the method deleted (N) trailing zeros from the XOR data stream of step 1060 (FIG. 10) to generate the first truncated XOR data stream. In step 110, the method aligns the first bit of the convolution-encoded first truncated XOR data stream of step 1130 with [(2)(N)+1]th bit of the convolution-encoded original data.

In certain embodiments, step 1140 is performed by the host computer that provides the original data of step 1020 (FIG. 10). In certain embodiments, step 1140 is performed by a storage controller, such as storage controller 131 (FIG. 1). In certain embodiments, step 1140 is performed by a processor, such as processor 140 (FIG. 1), disposed in a storage controller.

As an example and referring now to FIGS. 7A, 8A, and 8C, XOR data stream 700 comprises (N) leading zeros, wherein (N) is 13. Those 13 leading zeros were deleted to form first truncated XOR data stream 800. In step 1140, the method aligns the first bit of the convolution-encoded first truncated XOR data stream 810 with the $27^{th}$ bit [(2)(13)+1] of the convolution-encoded original data 620.

Referring once again to FIG. 11, in step 1150 the method Exclusive ORs the indexed convolution-encoded XOR data stream of step 1130 with the convolution-encoded original data of step 1030 to form convolution-encoded revised data. In certain embodiments, step 1150 is performed by the host computer that provides the original data of step 1020. In certain embodiments, step 1150 is performed by a storage controller, such as storage controller 131 (FIG. 1). In certain embodiments, step 1150 is performed by a processor, such as processor 140 (FIG. 1), disposed in a storage controller.

Figure 8D:
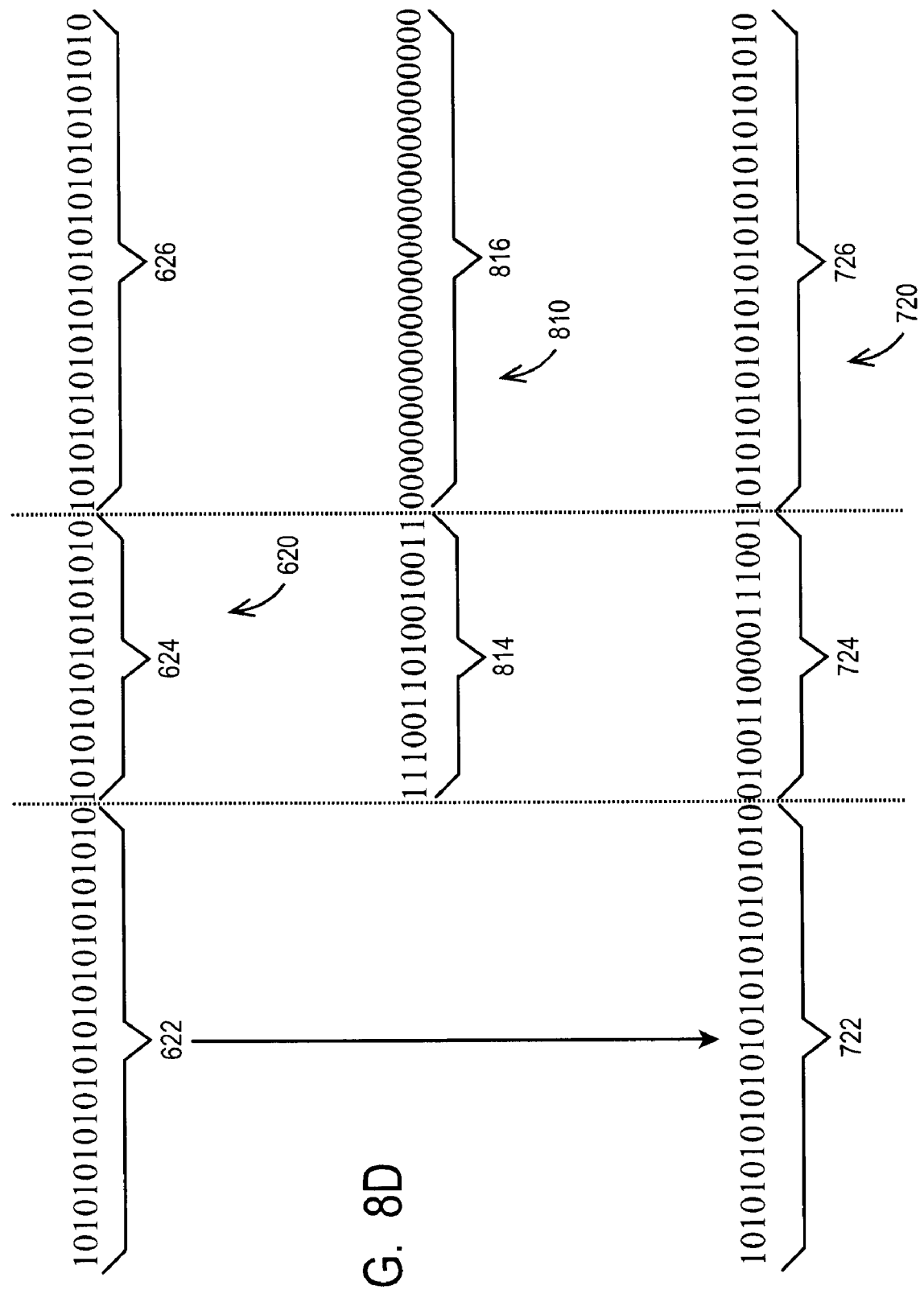
FIG. 8D shows the convolution encoded original data of FIG. 6C being Exclusive OR'd with the indexed convolution encoded first truncated XOR data stream of FIG. 8C to generate convolution encoded revised data.

As an example and referring to FIG. 8D, convolution-encoded first truncated XOR data stream 810 does not comprise a portion corresponding to portion 622 of convolution-encoded original data 620. Therefore in step 1150, the method copies portion 622 as the first portion 722 of convolution-encoded revised data 720. Further in step 1150, the method Exclusive ORs portion 624 of convolution-encoded original data 620 with portion 814 of convolution-encoded first truncated XOR data stream 810 to produce convolution-encoded portion 724 of convolution-encoded revised data 720, and Exclusive ORs portion 626 of convolution-encoded original data 620 with portion 816 of convolution-encoded first truncated XOR data stream 810 to produce third portion 726 of convolution-encoded revised data 720, to complete the generation of convolution-encoded revised data 720.

Referring once again to FIG. 11, if the method elects in step 1120 to generate and use a second truncated XOR data streams, then the method transitions from step 1120 to step 1160 wherein the method generates a second truncated XOR data stream. In certain embodiments, step 1160 is performed by the host computer that provides the original data of step 1020. In certain embodiments, step 1160 is performed by a storage controller, such as storage controller 131 (FIG. 1). In certain embodiments, step 1160 is performed by a processor, such as processor 140 (FIG. 1), disposed in a storage controller.

As an example and referring now to FIGS. 8A and 9A, first truncated XOR data stream 800 comprises change bit portion 804 and portion 806 comprising (P) trailing zeros. In step 1160 the method generates a second truncated XOR data stream 900 by deleting [(P)−(m)] of the trailing zeros, wherein (m) equals the number of registers used in convolution encoder of step 1010 (FIG. 10). In the illustrated embodiment of FIG. 9A, second truncated XOR data stream 900 comprises changed bit portion 902 in combination with 3 trailing zeros portion 904.

Referring once again to FIG. 1, in step 1170 the method convolution encodes the second truncated XOR data stream of step 1160, such as second truncated XOR data stream 900 (FIG. 9A). In certain embodiments, step 1170 is performed by the host computer that provides the original data of step 1020 (FIG. 10). In certain embodiments, step 1170 is performed by a storage controller, such as storage controller 131 (FIG. 1). In certain embodiments, step 1170 is performed by a processor, such as processor 140 (FIG. 1), disposed in a storage controller.

Figure 9B:
FIG. 9B shows a convolution encoded second truncated XOR data stream formed by convolution encoding the second truncated XOR data stream of FIG. 9A using the convolution encoder circuit of FIG. 2.

As an example and referring now to FIGS. 2, 9A, and 9B, convolution-encoded second truncated XOR data stream 910 is formed using second truncated XOR data stream 900 and convolution encoder circuit 200. Convolution-encoded second truncated XOR data stream 910 is generated by convolution encoding portions 902 and 904.

Referring once again to FIG. 11, in step 1180 the method indexes the convolution-encoded second truncated XOR data stream of step 1170 to the convolution-encoded original data of step 1030 (FIG. 10). In step 1110, the method deleted (N) trailing zeros from the XOR data stream of step 1060 (FIG. 10) to generate the first truncated XOR data stream. In step 1180, the method aligns the first bit of the convolution-encoded second truncated XOR data stream of step 1170 with [(2)(N)+1]th bit of the convolution-encoded original data.

In certain embodiments, step 1180 is performed by the host computer that provides the original data of step 1020 (FIG. 10). In certain embodiments, step 1180 is performed by a storage controller, such as storage controller 131 (FIG. 1). In certain embodiments, step 1180 is performed by a processor, such as processor 140 (FIG. 1), disposed in a storage controller.

As an example and referring now to FIGS. 7A, 8A, and 9C, XOR data stream 700 comprises (N) leading zeros, wherein (N) is 13. Those 13 leading zeros were deleted to form first truncated XOR data stream 800. In step 1180, the method aligns the first bit of the convolution-encoded second truncated XOR data stream 910 with the $27^{th}$ bit [(2)(13)+1] of the convolution-encoded original data 620.

Referring once again to FIG. 11, in step 1190 the method Exclusive ORs the indexed convolution-encoded second truncated XOR data stream of step 1180 with the convolution-encoded original data of step 1030 to form convolution-encoded revised data. In certain embodiments, step 1190 is performed by the host computer that provides the original data of step 1020. In certain embodiments, step 1190 is performed by a storage controller, such as storage controller 131 (FIG. 1). In certain embodiments, step 1190 is performed by a processor, such as processor 140 (FIG. 1), disposed in a storage controller.

Figure 9D:
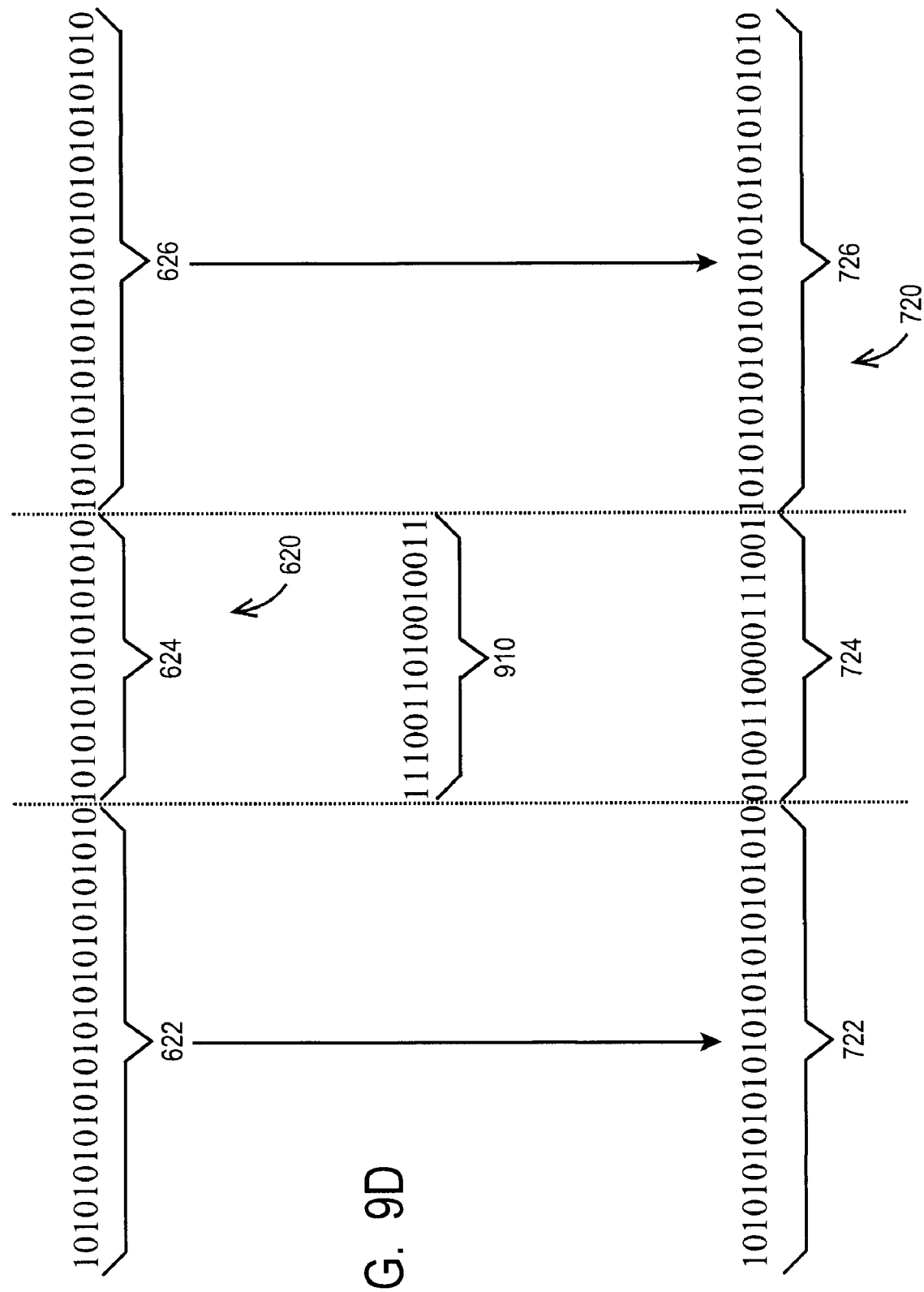
FIG. 9D shows the convolution encoded original data of FIG. 6C being Exclusive OR'd with the indexed convolution encoded second truncated XOR data stream of FIG. 9C to generate convolution encoded revised data.

As an example and referring to FIG. 9D, convolution-encoded second truncated XOR data stream 910 does not comprise either an portion corresponding to portion 622 of convolution-encoded original data 620, or an portion corresponding to portion 626 of convolution-encoded original data 620. In step 1190, the method copies portion 622 as portion 722 of convolution-encoded revised data 720. Further in step 1190, the method copies portion 626 as portion 726 of convolution-encoded revised data 720. Further in step 1190, the method Exclusive ORs portion 624 of convolution-encoded original data with portion convolution-encoded second truncated XOR data stream 910 to create updated portion 724, which completes the generation of convolution-encoded revised data 720.

In certain embodiments, individual steps recited in FIGS. 10 and 11 may be combined, eliminated, or reordered. For example, a first embodiment of Applicants' method comprises 8 steps including steps 1010, 1020, 1030, 1040, 1050, 1060, 1080, and 1090 of FIG. 10. A second embodiment of Applicants' method comprises 10 steps including steps 1010, 1020, 1030, 1040, 1050, 1060, of FIG. 10, in combination with steps 1110, 1130, 1140, and 1150, of FIG. 11. A third embodiment of Applicants' method comprises steps 11 steps including 1010, 1020, 1030, 1040, 1050, 1060, of FIG. 10, in combination with steps 1110, 1160, 1170, 1180, and 1190, of FIG. 11.

The 8-step first embodiment is most useful where the ratio between the revised bits and the original bits in the revised data is high, i.e. almost all of the original bits have been revised. On the other hand, where the ratio between the revised bits and the original bits is very low, i.e. an "atomic" update, then use of the 11-step third embodiment is preferred.

Although the third embodiment comprises 11 steps, that third embodiment requires much less computing power and time for an "atomic" update because the third embodiment utilizes step 1170 wherein a substantially truncated XOR data stream, namely the second truncated XOR data stream, is convolution encoded. In addition, the 11-step third embodiment requires much less computing power and time because that third embodiment utilizes step 1190 wherein only that convolution-encoded second XOR data stream is Exclusive OR'd with the convolution-encoded original data.

Any of the afore-described embodiments of Applicants' apparatus and method may be used by a data storage services provider to provide data storage services to one or more data storage services customers. In certain embodiments, one or more data storage services customers own and/or operate one or more of host computers 101 (FIG. 1), 103 (FIG. 1), 105 (FIG. 1), 107 (FIG. 1), and/or 109 (FIG. 1). Those one or more data storage services customers provide customer data from the one or more host computers to a storage array, such as storage array 130 (FIG. 1), wherein that storage array is owned and/or operated by the data storage services provider.

In certain embodiments, Applicants' invention includes instructions residing memory 150 (FIG. 1), wherein those instructions are executed by a processor, such as processor 140 (FIG. 1), to perform one or more of steps 1020, 1030, 1040, 1050, 1060, 1070, 1080, and/or 1090, recited in FIG. 10, and/or one or more of steps 1110, 1120, 1130, 1140, 1150, 1160, 1170, 1180, and/or 1190, recited in FIG. 11.

In other embodiments, Applicants' invention includes instructions residing in any other computer program product, where those instructions are executed by a computer external to, or internal to, system 100, to perform one or more of steps 1020, 1030, 1040, 1050, 1060, 1070, 1080, and/or 1090, recited in FIG. 10, and/or one or more of steps 1110, 1120, 1130, 1140, 1150, 1160, 1170, 1180, and/or 1190, recited in FIG. 11. In either case, the instructions may be encoded in an information storage medium comprising, for example, a magnetic information storage medium, an optical information storage medium, an electronic information storage medium, and the like. By "electronic storage media," Applicants mean, for example, a device such as a PROM, EPROM, EEPROM, Flash PROM, compactflash, smartmedia, and the like.

While the preferred embodiments of the present invention have been illustrated in detail, it should be apparent that modifications and adaptations to those embodiments may occur to one skilled in the art without departing from the scope of the present invention as set forth in the following claims.

We claim:

1. A method to generate convolution encoded data, comprising the steps of:
   supplying a convolution encoder comprising (m) stages, wherein (m) is greater than or equal to 1;
   providing original data;

generating convolution encoded original data using said convolution encoder;

providing revised data, wherein said revised data comprises a sequence of original bits in combination with a sequence of revised bits;

generating an XOR data stream by Exclusive OR'ing said original data with said revised data, wherein said XOR data stream comprises a plurality of changed bits in combination with a plurality of leading zeros and a plurality of trailing zeros;

determining whether to use a truncated XOR data stream;

if a truncated XOR data stream will not be used, then:

forming a convolution encoded XOR data stream using said convolution encoder; and Exclusive OR'ing said convolution encoded XOR data stream with said convolution encoded original data.

2. The method of claim 1, wherein said supplying a convolution encoder step further comprises supplying a convolution encoder comprising 3 stages.

3. The method of claim 1, further comprising the steps of:

supplying a data storage system in communication with a host computer, wherein said data storage system comprises said convolution encoder and a data storage medium;

wherein said providing step further comprises providing said original data to said data storage system by said host computer.

4. The method of claim 3, further comprising the step of saving said convolution-encoded original data in said data storage medium.

5. The method of claim 1, wherein said original data comprises (N) bits and wherein said convolution encoded original data comprises (2)(N) bits.

6. The method of claim 1, further comprising the steps of:

if a truncated XOR data stream will be used, determining whether to use a second truncated XOR data stream;

if a second truncated XOR data stream will not be used, forming a first truncated XOR data stream by deleting said plurality of leading zeros from said XOR data stream;

forming a convolution encoded first truncated XOR data stream using said convolution encoder;

indexing said convolution encoded first truncated XOR data stream to said convolution encoded original data;

Exclusive OR'ing said convolution encoded first truncated XOR data stream with said indexed convolution encoded original data.

7. The method of claim 6, further comprising the steps of:

if a second truncated XOR data stream will be used, forming a second truncated XOR data stream by deleting all but (m) of said plurality of trailing zeros from said first truncated XOR data stream;

forming a convolution encoded second truncated XOR data stream using said convolution encoder;

indexing said convolution encoded second truncated XOR data stream to said convolution encoded original data;

Exclusive OR'ing said convolution encoded second truncated XOR data stream with said indexed convolution encoded original data.

8. An article of manufacture comprising a convolution encoder comprising (m) stages and a computer readable medium having computer readable program code disposed therein to generate convolution encoded data, wherein (m) is greater than or equal to 1, the computer readable program code comprising a series of computer readable program steps to effect:

receiving original data;

generating convolution encoded original data;

receiving revised data, wherein said revised data comprises a sequence of original bits in combination with a sequence of revised bits;

generating an XOR data stream by Exclusive OR'ing said original data with said revised data, wherein said XOR data stream comprises a plurality of changed bits in combination with a plurality of leading zeros and a plurality of trailing zeros;

determining whether to use a truncated XOR data stream;

if a truncated XOR data stream will not be used, then:

forming a convolution encoded XOR data stream using said convolution encoder; and Exclusive OR'ing said convolution encoded XOR data stream with said convolution encoded original data.

9. The article of manufacture of claim 8, wherein said convolution encoder comprises 3 stages.

10. The article of manufacture of claim 8, wherein said article of manufacture is disposed in a data storage system comprising a data storage medium, said computer readable program code further comprising a series of computer readable program steps to effect storing said convolution encoded original data in said data storage medium.

11. The article of manufacture of claim 8, wherein said original data comprises (N) bits and wherein said convolution encoded original data comprises (2)(N) bits, wherein (N) is greater than or equal to 1.

12. The article of manufacture of claim 8, said computer readable program code further comprising a series of computer readable program steps to effect:

if a truncated XOR data stream will be used, determining whether to use a second truncated XOR data stream;

if a second truncated XOR data stream will not be used, forming a first truncated XOR data stream by deleting said plurality of leading zeros from said XOR data stream;

forming a convolution encoded first truncated XOR data stream using said convolution encoder;

indexing said convolution encoded first truncated XOR data stream to said convolution encoded original data;

Exclusive OR'ing said convolution encoded first truncated XOR data stream with said indexed convolution encoded original data.

13. The article of manufacture of claim 12, said computer readable program code further comprising a series of computer readable program steps to effect:

if a second truncated XOR data stream will be used, forming a second truncated XOR data stream by deleting all but (m) of said plurality of trailing zeros from said first truncated XOR data stream;

forming a convolution encoded second truncated XOR data stream using said convolution encoder;

indexing said convolution encoded second truncated XOR data stream to said convolution encoded original data;

Exclusive OR'ing said convolution encoded second truncated XOR data stream with said indexed convolution encoded original data.

14. A computer program product encoded in a computer readable medium disposed in data storage system comprising a processor, a convolution encoder, and a data storage medium, said computer program product being useable with said processor to generate convolution encoded data, comprising:

computer readable program code which causes said programmable computer processor to receive original data;

computer readable program code which causes said programmable computer processor to generate convolution encoded original data;

computer readable program code which causes said programmable computer processor to receive revised data, wherein said revised data comprises a sequence of original bits in combination with a sequence of revised bits;

computer readable program code which causes said programmable computer processor to generate an XOR data stream by Exclusive OR'ing said original data with said revised data, wherein said XOR data stream comprises a plurality of changed bits in combination with a plurality of leading zeros and a plurality of trailing zeros;

computer readable program code which causes said programmable computer processor to determine whether to use a truncated XOR data stream;

computer readable program code which, if a truncated XOR data stream will not be used causes said programmable computer processor to:

form a convolution encoded XOR data stream using said convolution encoder; and

Exclusive OR said convolution encoded XOR data stream with said convolution encoded original data.

15. The computer program product of claim 14, wherein said convolution encoder comprises 3 stages.

16. The computer program product of claim 14, further comprising computer readable program code which causes said programmable computer processor to store said convolution encoded original data in said data storage medium.

17. The computer program product of claim 14, wherein said original data comprises (N) bits and wherein said convolution encoded original data comprises (2)(N) bits, wherein (N) is greater than or equal to 1.

18. The computer program product of claim 14, further comprising:

computer readable program code which, if a truncated XOR data stream will be used, causes said programmable computer processor to determine whether to use a second truncated XOR data stream;

computer readable program code which, if a second truncated XOR data stream will not be used, causes said programmable computer processor to form a first truncated XOR data stream by deleting said plurality of leading zeros from said XOR data stream;

computer readable program code which causes said programmable computer processor to form a convolution encoded first truncated XOR data stream using said convolution encoder;

computer readable program code which causes said programmable computer processor to index said convolution encoded first truncated XOR data stream to said convolution encoded original data;

computer readable program code which causes said programmable computer processor to Exclusive OR said convolution encoded first truncated XOR data stream with said indexed convolution encoded original data.

19. The computer program product of claim 18, further comprising:

computer readable program code which, if a second truncated XOR data stream will be used, causes said programmable computer processor to form a second truncated XOR data stream by deleting all but (m) of said plurality of trailing zeros from said first truncated XOR data stream;

computer readable program code which causes said programmable computer processor to form a convolution encoded second truncated XOR data stream using said convolution encoder;

computer readable program code which causes said programmable computer processor to index said convolution encoded second truncated XOR data stream to said convolution encoded original data;

computer readable program code which causes said programmable computer processor to Exclusive OR said convolution encoded second truncated XOR data stream with said indexed convolution encoded original data.

20. A method to provide data storage services by a data storage services provider to a data storage services customer, comprising the steps of:

supplying a convolution encoder comprising (m) stages;

receiving by said data storage services provider from said data storage services original customer data;

generating convolution encoded original customer data using said convolution encoder.

said supplying a convolution encoder step further comprises supplying by said data storage services customer a convolution encoder comprising 3 stages;

said data storage services customer performs said generating step providing by said data storage services customer revised customer data, wherein said revised customer data comprises a sequence of original bits in combination with a sequence of revised bits;

generating by said data storage services provider an XOR data stream by Exclusive OR'ing said original customer data with said revised customer data, wherein said XOR data stream comprises a plurality of changed bits in combination with a plurality of leading zeros and a plurality of trailing zeros;

determining by said data storage services provider whether to use a truncated XOR data stream;

if a truncated XOR data stream will not be used, then:

forming by said data storage services provider a convolution encoded XOR data stream using said convolution encoder; and Exclusive OR'ing by said data storage services provider said convolution encoded XOR data stream with said convolution encoded original data.

21. The method of claim 20, further comprising:

if a truncated XOR data stream will be used, determining by said data storage services provider whether to use a second truncated XOR data stream;

if a second truncated XOR data stream will not be used, forming by said data storage services provider a first truncated XOR data stream by deleting said plurality of leading zeros from said XOR data stream;

forming by said data storage services provider a convolution encoded first truncated XOR data stream using said convolution encoder;

indexing by said data storage services provider said convolution encoded first truncated XOR data stream to said convolution encoded original data;

Exclusive OR'ing by said data storage services provider said convolution encoded first truncated XOR data stream with said indexed convolution encoded original data.

22. The method of claim 21, further comprising the steps of:

operative if a second truncated XOR data stream will be used, forming by said data storage services provider a second truncated XOR data stream by deleting all but (m) of said plurality of trailing zeros from said first truncated XOR data stream;

forming by said data storage services provider a convolution encoded second truncated XOR data stream using said convolution encoder;

indexing by said data storage services provider said convolution encoded second truncated XOR data stream to said convolution encoded original data;

Exclusive OR'ing by said data storage services provider said convolution encoded second truncated XOR data stream with said indexed convolution encoded original data.

* * * * *